United States Patent
Chang et al.

(10) Patent No.: US 6,822,841 B2
(45) Date of Patent: Nov. 23, 2004

(54) CIRCUIT BOARD WITH PROTECTION CAPABILITY AND METHOD OF PROTECTING A CIRCUIT BOARD

(75) Inventors: Ting-Yu Chang, Hsichih (TW); Chih-Hung Wu, Hsichih (TW)

(73) Assignee: Aopen Incorporated, Taipei Hsien (TW)

(*) Notice: Subject to any disclaimer, the term of this patent is extended or adjusted under 35 U.S.C. 154(b) by 219 days.

(21) Appl. No.: 10/167,529

(22) Filed: Jun. 11, 2002

(65) Prior Publication Data

US 2003/0227728 A1 Dec. 11, 2003

(30) Foreign Application Priority Data

Mar. 13, 2002 (TW) ........................................ 91104713 A

(51) Int. Cl.$^7$ ................................................ H02H 1/04
(52) U.S. Cl. ........................ 361/110; 361/88; 307/130; 710/302
(58) Field of Search ........................ 361/91.1, 86, 88, 361/110; 307/125, 119, 85–87, 328, 116, 126, 130, 134; 395/750; 327/541; 365/226; 710/302, 105, 301, 303, 304; 713/340, 324, 300, 600

(56) References Cited

U.S. PATENT DOCUMENTS 5,773,901 A * 6/1998 Kantner ...................... 307/125
6,181,118 B1 * 1/2001 Meehan et al. ............. 323/274
6,529,967 B1 * 3/2003 Robertson .................... 710/16

* cited by examiner

Primary Examiner—Ronald Leja
(74) Attorney, Agent, or Firm—Merchant & Gould P.C.

(57) ABSTRACT

A circuit board includes a power switch operable so as to generate a trigger signal upon actuation, a card slot adapted for connecting with a video card, and a controller coupled electrically to the power switch and the card slot. The controller detects connection of the video card to the card slot and further detects operating voltage of the video card. The controller inhibits the power switch from generating the trigger signal upon detection that the operating voltage of the video card that is connected to the card slot is higher than a predetermined voltage.

6 Claims, 3 Drawing Sheets

CIRCUIT BOARD WITH PROTECTION CAPABILITY AND METHOD OF PROTECTING A CIRCUIT BOARD

BACKGROUND OF THE INVENTION

1. Field of the Invention

The invention relates to a circuit board, more particularly to a circuit board with a protection capability and to a method of protecting a circuit board.

2. Description of the Related Art

With the progress in semiconductor manufacturing technology, the performance and operational capability of semiconductor products have been enhanced to a considerable extent. In order to avoid problems of increased power consumption and heat generation that are associated with enhanced performance and operational capability of the semiconductor products, the trend in the current development of electronic products is toward low power consumption. As such, there are available in the marketplace products that comply with higher operating voltage specifications and those that comply with lower operating voltage specifications. For instance, the operating voltages of many of the components of a motherboard have been reduced, and the operating voltages of chip sets for data transmission between central processing units and peripheral devices have also been reduced, such as the INTEL 850/845 chip set, which supports a video card requiring an operating voltage of 1.5V.

Current video cards have different standards of accelerated graphics port (hereinafter referred to as AGP), e.g., 1x/2x/4x/8x. An AGP4x/8x video card operates at an operating voltage that is different from the earlier AGP1x/2x, which operates at 3.3V. Due to the difference in operating voltage, caution has to be exercised when mounting a video card on a motherboard lest that the components of the motherboard should be damaged. For instance, if an AGP1x/2x video card is connected to a motherboard employing an 845/850 chip set, an operating voltage of 3.3V will be supplied to the motherboard after activation, which is likely to result in damage to the components of the motherboard, such as the chip set.

To avoid the aforesaid problem, a video card is generally formed with a groove in a conductive terminal side thereof at a position corresponding to its operating voltage during manufacture, and a motherboard with a card slot for receiving the video card is correspondingly provided with a projection for engaging the groove in the video card. Hence, insertion of a video card that is not provided with the suitable groove is unable to fit into the card slot. However, as some manufacturers may form a 3.3V video card with a groove that is normally designed to identify a 1.5V video card, connection of the 3.3V video card to a card slot for a 1.5V video card is still possible and can result in damage to the chip set on the motherboard upon activation. Therefore, how to avoid the occurrence of the aforesaid situations has become an important topic in the industry.

A conventional video card is provided with a plurality of conductive terminals. A card slot on a motherboard for receiving the video card is provided with contacts corresponding to the conductive terminals so as to establish electrical connection between the video card and the motherboard. To facilitate connection between the video card and the motherboard, the design of the video card has to comply with certain rules. According to such rules, one of the conductive terminals of the video card, in the case of a 3.3V video card, remains disconnected or, in the case of a 1.5V video card, is grounded. Thus, if the operation of the motherboard can be inhibited when the aforesaid conductive terminal is in a disconnected state, possible damage to the chip set can be avoided.

SUMMARY OF THE INVENTION

Therefore, the main object of the present invention is to provide a method of protecting a circuit board, which can prevent connection of a video card of an incompatible operating voltage specification from damaging the circuit board.

Another object of the present invention is to provide a circuit board with a protection capability so as to reduce the possibility of damage thereto.

A further object of the present invention is to provide a circuit board with a protection capability, in which operation of the circuit board is inhibited when a video card of an incompatible operating voltage specification is connected to the circuit board.

According to one aspect of the present invention, the circuit board includes:

a power switch operable so as to generate a trigger signal upon actuation;

a card slot adapted for connecting with a video card; and a controller coupled electrically to the power switch and the card slot, the controller detecting connection of the video card to the card slot and further detecting operating voltage of the video card, the controller inhibiting the power switch from generating the trigger signal upon detection that the operating voltage of the video card that is connected to the card slot is higher than a predetermined voltage.

According to another aspect of the present invention, a method for protecting a circuit board includes the steps of:

a) detecting whether an operating voltage of a video card that is connected to the circuit board is higher than a predetermined voltage; and b) inhibiting operation of the circuit board upon detection that the operating voltage of the video card is higher than the predetermined voltage.

According to a further aspect of the present invention, there is provided a method for protecting a circuit board that includes a power circuit for controlling supply of electrical power to the circuit board, and a card slot adapted for connecting with a card member that is one of a high-operating-voltage-specification integrated circuit card and a low-operating-voltage-specification integrated circuit card. The method includes the steps of:

detecting operating voltage of the card member that is connected to the card slot; and inhibiting the power switch from generating the trigger signal upon detection that the card member that is connected to the card slot is the high-operating-voltage-specification integrated circuit card to prevent damage to the circuit board.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
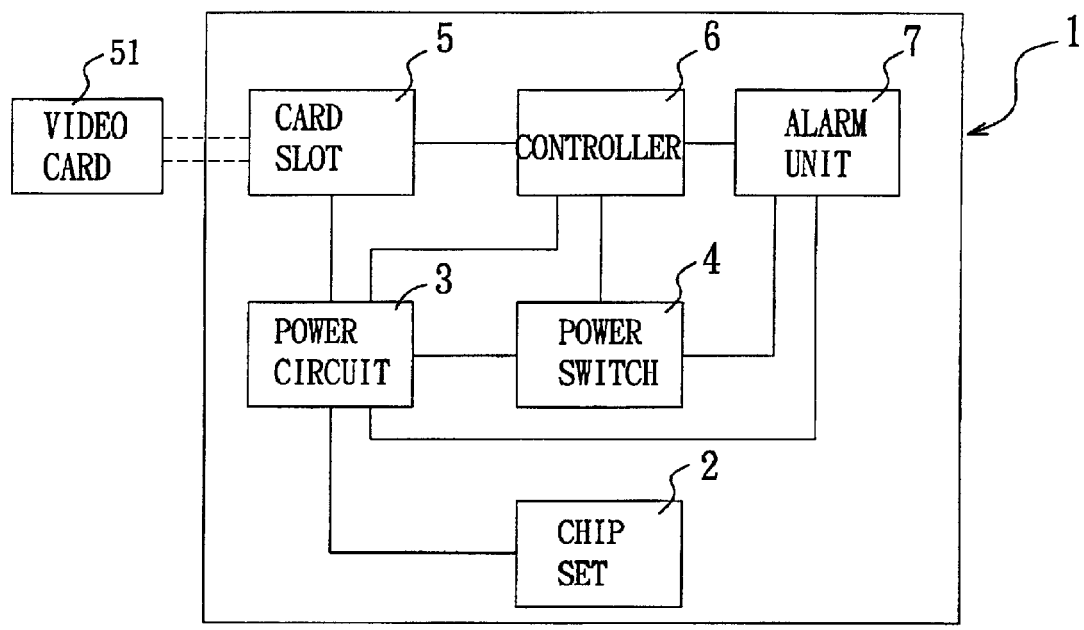
FIG. 1 is a schematic circuit block diagram of a preferred embodiment of a circuit board according to the invention.

FIG. 1 is a schematic circuit block diagram of the preferred embodiment of a circuit board 1 according to the present invention. The circuit board 1 is exemplified as a motherboard of a computer system, and is shown to include a chip set 2, a power circuit 3, a power switch 4, a card slot 5, and a controller 6. The circuit board 1 further includes other known electronic components, such as memories, which are not described herein for the sake of brevity and for the reason that the salient features of the present invention do not reside therein.

The chip set 2 includes South Bridge and North Bridge chip sets, and is the control center of the circuit board 1. The chip set 2 monitors data transmission among all the components within the computer system. In the embodiment, the chip set 2 may be an Intel 850 or 845 chip set, and operates at a predetermined voltage of 1.5V.

The power circuit 3 controls supply of electrical power from a power supply (not shown) to the circuit board 1 so as to activate the computer system according to factors, such as actuation of the power switch 4. As the electric power supplied to the circuit board 1 is generally divided into a general power source (V) and a back-up power source ($V_{SB}$), the power circuit 3 includes a main power circuit (not shown) and a back-up power circuit (not shown). The main power circuit supplies a general power source (V) to the circuit board 1 in a timely fashion according to the state of the controller 6, thereby providing the circuit board 1 with the necessary power for activation. The back-up power circuit provides a continuous supply of a back-up power source ($V_{SB}$) to relevant components on the circuit board 1 regardless of whether the computer system is in an activated state, i.e., providing the controller 6 with the necessary operating power.

The power switch 4 is operable so as to generate a trigger signal to the power circuit 3 upon actuation. In this embodiment, the power switch 4 has a push button (not shown) exposed from a computer housing (not shown) of the computer system. When the power circuit 3 receives the trigger signal, the power circuit 3 will supply the general power source (V) to the circuit board 1 to thereby activate the computer system.

Figure 2:
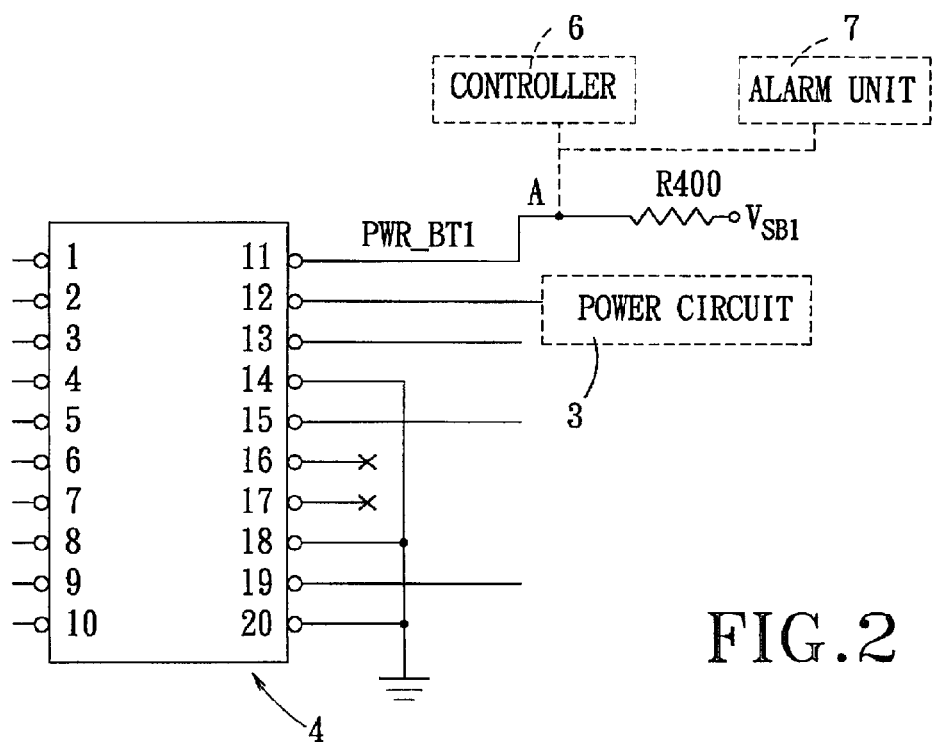
FIG. 2 is a schematic circuit diagram of a portion of the preferred embodiment.

FIG. 2 is a circuit diagram of the power switch 4. Pins 11, 12 of the power switch 4 are connected electrically and respectively to two ends of the push button (not shown) of the power switch 4. Under normal conditions, the pins 11, 12 are disconnected electrically. When the power switch 4 is actuated, electrical connection between the pins 11, 12 will be established. The pin 11 is connected electrically to the back-up power source ($V_{SB1}$) via a resistor (R400) whereas the pin 12 is connected electrically to the power circuit 3. Hence, when the power switch 4 is actuated, the pin 11 will be connected to the pin 12 to enable connection of the back-up power source ($V_{SB1}$) to the power circuit 3 via the pins 11, 12 to serve as the trigger signal for triggering the power circuit 3 so as to activate the computer system. On the contrary, if the power switch 4 is not actuated, the pins 11, 12 are disconnected. Consequently, the back-up power source ($V_{SB1}$) is disconnected from the pin 12, and the power switch 4 will not generate the trigger signal for triggering the power circuit 3.

Figure 3:
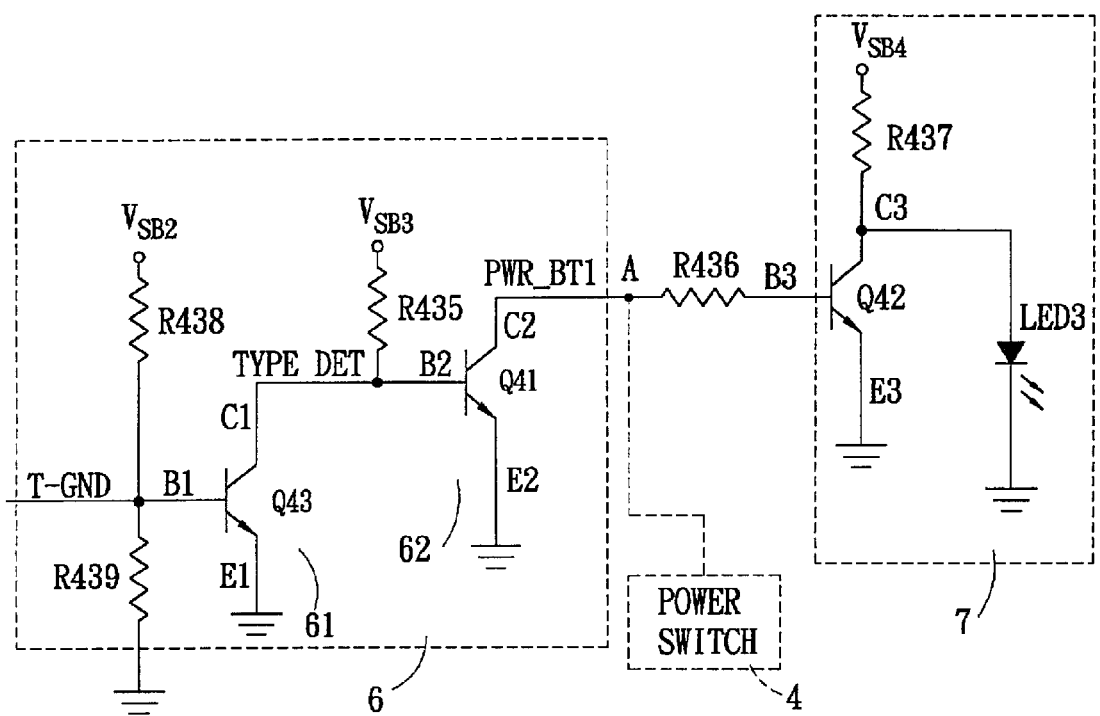
FIG. 3 is a schematic circuit diagram showing a controller and an alarm unit of the preferred embodiment.

Referring to FIG. 3, the card slot 5 is adapted for connection with a video card 51, which is a card member that is one of a high-operating-voltage-specification integrated circuit card and a low-operating-voltage-specification integrated circuit card. The card slot 5 includes a plurality of contacts corresponding to conductive terminals of the video card 51. According to existing standards in the industry, the card slot 5 includes a first contact (T_GND) and a second contact (TYPEDET). The video card 51 has first and second conductive terminals (not shown) for connection with the first and second contacts (T_GND), (TYPEDET) when the video card 51 is inserted into the card slot 5. The first conductive terminal is grounded, whereas the second conductive terminal is grounded according to the operating voltage specification of the video card 51. In this embodiment, the second conductive terminal is not grounded when the operating voltage of the video card 51 is 3.3V, which is higher than a predetermined voltage of the circuit board 1 that is 1.5V. The second conductive terminal is grounded when the operating voltage of the video card 51 corresponds to the predetermined voltage of the circuit board 1, i.e., 1.5V. As such, the logic state of the first contact (T_GND) that is connected to the first conductive terminal can be relied upon to detect connection of the video card 51 to the card slot 5, and the logic state of the second contact (TYPEDET) that is connected to the second conductive terminal can be used to detect the operating voltage of the video card 51, which are to be described in greater detail hereinafter.

The controller 6 is coupled electrically to the power switch 4 and the card slot 5. The controller 6 detects connection of the video card 51 to the card slot 5 and further detects the operating voltage of the video card 51. The controller 6 inhibits the power switch 4 from generating the trigger signal upon detecting that the operating voltage of the video card 51 that is connected to the card slot 5 is higher than the predetermined voltage, does not correspond to the predetermined voltage, can cause damage to the circuit board 1, or that the video card 51 is a high-operating-voltage-specification integrated circuit card. In this embodiment, the controller 6 includes a first detector 61 for detecting connection of the video card 51 to the card slot 5, and a second detector 62 connected to the first detector 61 and the power switch 4. The second detector 62 detects whether the operating voltage of the video card 51 that is connected to the card slot 5 is higher than the predetermined voltage, and inhibits the power switch 4 from generating the trigger signal upon detection by the first detector 61 that the video card 51 is connected to the card slot 5 and upon detection by the second detector 62 that the operating voltage of the video card 51 that is connected to the card slot 5 is higher than the predetermined voltage.

The first detector 61 includes a first transistor (Q43) and two resistors (R438, R439) connected in series. The first transistor (Q43) has a first base (B1) connected to the first contact (T_GND) and the two resistors (R438, R439), a first collector (C1), and a grounded first emitter (E1). One end of the resistor (R438) which is not connected to any one of the first base (B1), the first contact (T_GND) and the resistor (R439) is connected to the back-up power source ($V_{SB2}$) One end of the resistor (R439) which is not connected to any one of the first base (B1), the first contact (T_GND) and the resistor (R438) is grounded. When the video card 51 has yet to be connected to the card slot 5, the first contact (T_GND) is at a first logic state, which is approximately equal to $V_{SB2}*R439/(R438+R439)$ and which is a high logic state, and the voltage corresponding to the first logic state is higher than an actuating voltage (approximately 0.7V) of the first transistor (Q43), whereby the first transistor (Q43) conducts to pull the first collector (C1) to ground. When the video card 51 is connected to the card slot 5, the first contact (T_GND), which is connected to the grounded first conductive terminal of the video card 51, is at a second logic state, which is a low logic state. At this state, the first transistor (Q43) does not conduct, and the first collector (C1) will not be pulled to the ground. As such, the logic state of the first contact (T_GND) can be determined by the operating state of the first transistor (Q43) to obtain information as to whether or not the video card 51 has been connected to the card slot 5.

The second detector 62 includes a second transistor (Q41) and a resistor (R435). The second transistor (Q41) has a second base (B2) connected to the resistor (R435), the first collector (C1) and the second contact (TYPEDET), a second collector (C2) connected to the pin 11 of the power switch 4 (i.e., node (A) in FIG. 2), and a grounded second emitter (E2). The conduction of the second transistor (Q41) depends on the operating state of the first transistor (Q43) and the logic state of the second contact (TYPEDET). That is, when the operating voltage of the video card 51 is 3.3V, since the second conductive terminal of the video card 51 that corresponds to the second contact (TYPEDET) is disconnected, i.e., floating, the second contact (TYPEDET) is in a third logic state (approximately $V_{SB3}$), which is a high logic state and which is sufficient to enable the second transistor (Q41) to conduct. On the other hand, when the operating voltage of the video card 51 is 1.5V, the second contact (TYPEDET) will be at a fourth logic state (a low logic state) due to grounding of the second conductive terminal of the video card 51, thereby inhibiting the second transistor (Q41) from conducting.

Based on the foregoing, the operation of the controller 6 can be roughly divided into three situations for explanatory purposes in the following paragraphs:

(1) The video card 51 has yet to be connected to the card slot 5 in the circuit board 1:

When the video card 51 is not connected to the card slot 5, there is no need to consider the states of the first and second contacts (T_GND, TYPEDET). Therefore, the first contact (T_GND) is at the first logic state, i.e., the first base (B1) is at the first logic state, thereby enabling the first transistor (Q43) to conduct, which in turn leads to grounding of the second base (B2) of the second transistor (Q41), whereby the second transistor (Q41) is not able to conduct, and the pin 11 of the power switch 4 is able to receive the back-up power source $V_{SB1}$. Thus, when the power switch 4 is actuated, i.e., the pins 11, 12 are connected, the pin 12 outputs the trigger signal by virtue of connection to the back-up power source ($V_{SB}$) for reception by the power circuit 3.

(2) The video card 51 is connected to the card slot 5, and the operating voltage thereof is not higher than the predetermined voltage of the circuit board 1:

After the video card 51 is connected to the card slot 5, since the first conductive terminal of the video card 51 that corresponds to the first contact (T_GND) is grounded, the first contact (T_GND) will be at the second logic state (i.e., grounded) so that the first transistor (Q43) does not conduct. Therefore, the conduction of the second transistor (Q41) can be determined according to the logic state of the second contact (TYPEDET). The second contact (TYPEDET) will be at the fourth logic state due to grounding of the second conductive terminal of the video card 51, so that the second transistor (Q41) does not conduct, as in the situation depicted in the preceding paragraph. At this point, the power switch 4 can still output the trigger signal to the power circuit 3. In this embodiment, in either of the two situations wherein the video card 51 has yet to be connected to the card slot 5 and the operating voltage of the video card 51 corresponds to the predetermined voltage of the circuit board 1, the controller 6 does not inhibit generation of the trigger signal.

(3) The video card 51 is connected to the card slot 5, and the operating voltage thereof is higher than the predetermined voltage of the circuit board 1:

In this situation, the first contact (T_GND) is at the second logic state (i.e., grounded), and the second contact (TYPEDET) is at the third logic state, so that the first transistor (Q43) does not conduct, whereas the second transistor (Q41) conducts. Hence, the voltage at the node (A), i.e., the pin 11 of the power switch 4 will be grounded via the second transistor (Q41). Under this circumstance, since the back-up power source ($V_{SB1}$) is unable to supply electric power via the pin 11 of the power switch 4, the power switch 4 is unable to output the trigger signal to the power circuit 3 regardless of whether the power switch 4 is actuated or not. As a result, the power circuit 3 will not be able to supply the general power source (V) to the circuit board 1 for activating the computer system. As such, possible damage to the chip set 2 and the circuit board 1 can be avoided.

Preferably, referring once again to FIG. 1, the circuit board 1 of the present invention further includes an alarm unit 7 connected to and enabled by the controller 6 to generate an alarm output when the operating voltage of the video card 51 that is connected to the card slot 5 is higher than the predetermined voltage. In this embodiment, the alarm unit 7 includes a third transistor (Q42), two resistors (R436, R437) and a light emitter in the form of a light emitting diode (LED3). The third transistor (Q42) has a third base (B3), a third collector (C3), and a grounded third emitter (E3). The resistor (R436) has one end connected electrically to the second collector (C2) of the second transistor (Q41) and thus to the pin 11 of the power switch 4, and another end connected electrically to the third base (B3) of the third transistor (Q42). The resistor (R437) has one end connected electrically to a back-up power source ($V_{SB4}$), and another end connected electrically to the third collector (C3) of the third transistor (Q42) and one terminal of the light emitting diode (LED3). The third emitter (E3) of the third transistor (Q42) and the other terminal of the light emitting diode (LED3) are grounded. As such, when the controller 6 is not activated (i.e., the second transistor (Q41) does not conduct), the back-up power source ($V_{SB1}$) of the power switch 4 will cause the third transistor (Q42) to conduct, whereby the light emitting diode (LED3) remains unactivated. On the contrary, upon activation of the controller 6 (i.e., when the second transistor (Q41) conducts), the third base (B3) of the third transistor (Q42) is grounded. The third transistor (Q42) does not conduct such that the light emitting diode (LED3) is activated due to its connection to the back-up power source ($V_{SB4}$) for generating a visible alarm output to alert the user.

Figure 4:
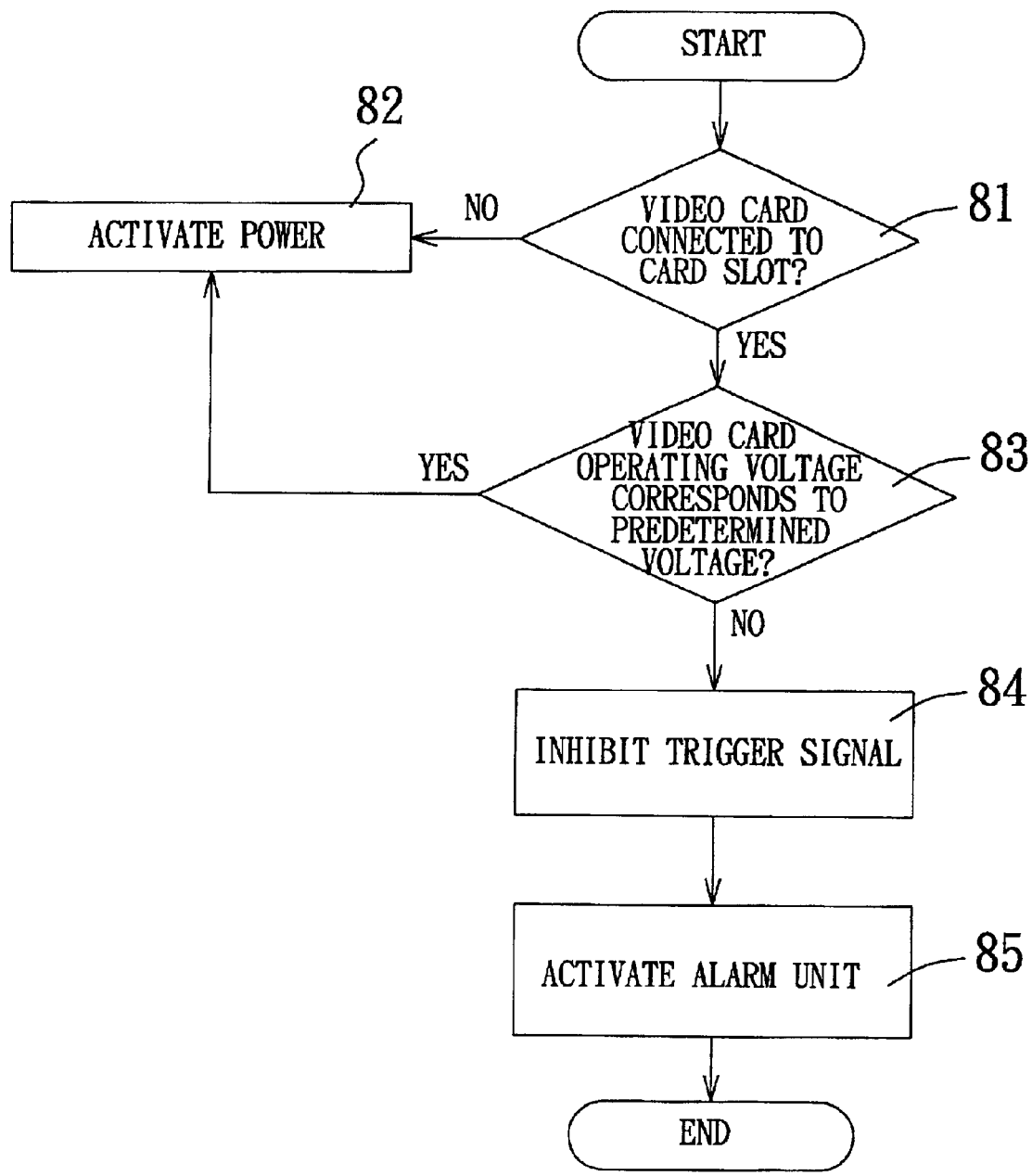
FIG. 4 is an operational flow chart of the preferred embodiment.

The operational flow of the preferred embodiment of a method for protecting the circuit board 1 according to the present invention will now be described with further reference to FIG. 4. First, in step 81, the first detector 61 detects whether the video card 51 has been connected to the card slot 5. When it is detected that the video card 51 has yet to be connected to the card slot 5, i.e., the first contact (T_GND) is at the first logic state, the flow goes to step 82. In step 82, the first transistor (Q43) conducts, whereas the second transistor (Q41) does not conduct, i.e., the controller 6 is not activated, and the power switch 4 is actuated as usual to supply electric power to the other components of the circuit board 1. When it is detected that the video card 51 is connected to the card slot 5 and that the first contact (T_GND) is at the second logic state, the flow goes to step 83, in which the second detector 62 detects whether the operating voltage of the video card 51 corresponds to the predetermined voltage of the circuit board 1. When it is detected that the operating voltage of the video card 51 corresponds to the predetermined voltage of the circuit board 1, i.e., the second contact (TYPEDET) is at the fourth logic state, both the first transistor (Q43) and the second transistor (Q41) of the controller 6 will not conduct, i.e., the controller 6 is not activated, and the flow will return to step 82 to enable the power switch 4 to output a trigger signal for activating the power circuit 3 and thus the computer system. In step 83, when it is detected that the operating voltage of the video card 51 does not correspond to the predetermined voltage of the circuit board 1, i.e., the second contact (TYPEDET) is at the third logic state, the flow goes to step 84. In step 84, the controller 6 is activated such that the first transistor (Q43) does not conduct and that the second transistor (Q41) conducts. The power switch 4 is inhibited from generating the trigger signal to the power circuit 3 due to grounding of the pin 11 at the node (A). As such, operation of the circuit board 1 is inhibited, thereby avoiding possible damage to the chip set 2. Finally, in step 85, the light emitting diode (LED3) of the alarm unit 7 is activated to indicate to the user that the operating voltage of the video card 51 does not correspond to the predetermined voltage of the circuit board 1 and that replacement of a video card having an operating voltage corresponding to the predetermined voltage of the circuit board 1 is needed. Note that, in the present invention, the operation of the power switch 4 and hence operation of the circuit board 1 will be inhibited when the operating voltage of the video card 51 is higher than the predetermined voltage or when the video card 51 is an integrated circuit card of a high-operating-voltage specification so as to prevent possible damage to the circuit board 1.

It has thus been shown that the circuit board 1 of the present invention can inhibit operation of the power switch 4 in spite of actuation of the power switch 4 upon detection that the video card 51 connected to the card slot 5 does not correspond to the predetermined voltage of the circuit board 1, thereby inhibiting the power circuit 3 from supplying a general power source (V) to the circuit board 1 for activating the computer system. As such, the present invention can eliminate the problems associated with the connection of a video card of an incompatible operating voltage specification to the card slot 5, thereby prolonging the service life of the circuit board 1. In addition, the alarm unit 7 will generate an alarm output when a video card of an incompatible operating voltage specification is mounted in the card slot 5 so as to remind the user to use a video card with a proper operating voltage, thereby enhancing the facility of installing the video card.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A circuit board comprising:
   a power switch;
   a card slot adapted for connecting with a video card; and
   a controller coupled electrically to said power switch and said card slot, said controller detecting connection of the video card to said card slot and further detecting operating voltage of the video card, said controller enabling said power switch to generate a trigger signal upon actuation of said power switch when said controller detects the video card has yet to be connected to said card slot or when the operating voltage of the video card that is connected to said card slot is riot higher than a predetermined voltage, said controller inhibiting said power switch from generating the trigger signal upon detection that the operating voltage of the video card that is connected to said card slot is higher than the predetermined voltage,
   wherein said controller includes a first detector for detecting connection of the video card to said card slot,
   said card slot including a first contact that is at a first logic state when the video card has yet to be connected to said card slot, and that is at a second logic state when the video card is connected to said card slot, the first logic state being a high logic state, the second logic state being a low logic state,
   said first detector including a first transistor having a first base connected to said first contact, a first collector, and a grounded first emitter,
   said first transistor conducting when said first contact is at the first logic state, and not conducting when said first contact is at the second logic state.

2. The circuit board as claimed in claim 1, wherein said controller further includes a second detector connected to said first detector and said power switch, said second detector detecting whether the operating voltage of the video card that is connected to said card slot is higher than the predetermined voltage, and inhibiting said power switch from generating the trigger signal upon detection by said first detector that the video card is connected to said card slot and upon detection by said second detector that the operating voltage of the video card that is connected to said card slot is higher than the predetermined voltage.

3. The circuit board as claimed in claim 2, wherein said card slot further includes a second contact that is at a third logic state when the operating voltage of the video card that is connected to said card slot is higher than the predetermined voltage, and that is at a fourth logic state when otherwise.

4. The circuit board as claimed in claim 3, wherein the third logic state is a high logic state, and the fourth logic state is a low logic state,
   said second detector including a second transistor having a second base connected to said first collector and said second contact, a second collector connected to said power switch, and a grounded second emitter,
   said second transistor conducting when said second contact is at the third logic state.

5. The circuit board as claimed in claim 1, further comprising an alarm unit connected to and enabled by said controller to generate an alarm output when the operating voltage of the video card that is connected to said card slot is higher than the predetermined voltage.

6. The circuit board as claimed in claim 5, said alarm unit includes a light emitter for generating a visible alarm output.

* * * * *